United States Patent
Nagano et al.

[19]

[11] Patent Number: 6,100,100
[45] Date of Patent: Aug. 8, 2000

[54] METHOD FOR MANUFACTURING CAPACITOR ELEMENT

[75] Inventors: Yoshihisa Nagano, Osaka; Yasuhiro Shimada, Kyoto; Eiji Fujii, Osaka, all of Japan

[73] Assignee: Matsushita Electronics Corporation, Osaka, Japan

[21] Appl. No.: 09/122,239

[22] Filed: Jul. 24, 1998

[51] Int. Cl.⁷ .............................. H01L 21/00; H01L 21/20
[52] U.S. Cl. ..................... 438/3; 438/396; 438/584; 438/381
[58] Field of Search ................. 438/3, 239, 268, 438/584, 490, 396, 381, 586; 117/7, 92

[56] References Cited

U.S. PATENT DOCUMENTS

| | | |
|---|---|---|
| 5,135,608 | 8/1992 | Okutani . |
| 5,423,285 | 6/1995 | Paz de Araujo et al. ............. 437/230 |
| 5,434,102 | 7/1995 | Watanabe et al. ..................... 437/130 |
| 5,468,684 | 11/1995 | Yoshimori et al. . |
| 5,624,864 | 4/1997 | Arita et al. . |
| 5,689,126 | 11/1997 | Takaishi . |
| 5,716,875 | 2/1998 | Jones, Jr. et al. . |
| 5,837,591 | 11/1998 | Shimada et al. . |
| 5,879,981 | 3/1999 | Tanigawa . |
| 5,972,096 | 10/1999 | Sawada et al. .................... 106/287.18 |

FOREIGN PATENT DOCUMENTS

| | | |
|---|---|---|
| 3-180040 | 8/1991 | Japan . |
| 7-221070 | 8/1995 | Japan . |
| 7-226443 | 8/1995 | Japan . |
| 8-153707 | 6/1996 | Japan . |
| 8-296067 | 11/1996 | Japan . |
| 9-279367 | 10/1997 | Japan . |
| 10-22464 | 1/1998 | Japan . |

OTHER PUBLICATIONS

Wolfe et al. *Silicon Processing for the VLSI Era*, vol. 1, pp. 57–58, Lattice Press, (1986, Month Unknown).

*Primary Examiner*—Richard Elms
*Assistant Examiner*—Michael S. Lebentritt
*Attorney, Agent, or Firm*—Merchant & Gould P.C.

[57] ABSTRACT

The method of this invention provides a method for manufacturing a capacitor element composed of films. The films have a precise etched shape without a residue that may be generated as a reaction product in a dry-etching process. In this invention, washing in a non-oxidizing atmosphere, inclining a side of a mask for etching or heating a substrate prevents the reaction product from remaining on the film as a residue. The reaction product can be washed away with water, acid or organic solvent in inert gas. The reaction product can be removed from the side of the mask by sputter-etching with ions for dry-etching. The reaction product can be exhausted without adhering to the mask by heating the substrate at a temperature between 100° C. and 400° C.

9 Claims, 6 Drawing Sheets

METHOD FOR MANUFACTURING CAPACITOR ELEMENT

FIELD OF THE INVENTION

The present invention relates to a semiconductor device. More particularly, the present invention relates to a method for manufacturing a capacitor element having a capacitor dielectric layer of a capacitor dielectric film with high dielectric constant or a ferroelectric film.

BACKGROUND OF THE INVENTION

Consumer electronic equipment has been further advanced in the recent trend toward high-speed and low power consumption for microcomputers etc., and semiconductor elements for semiconductor devices used in such computers are also miniaturized rapidly. Accordingly, undesirable radiation, that is, electromagnetic wave noise generated from electronic equipment, has been a serious problem. As a method to decrease such undesirable radiation, a technique to integrate capacitor elements with a large capacity in semiconductor integrated circuit devices and the like has attracted attention. Such capacitor elements have capacitor dielectric layers of dielectric with high dielectric constant (hereinafter, high dielectric). With the trend toward high integration of dynamic RAM, a technique to use high dielectric materials for a capacitor dielectric layer instead of conventional silicon oxides or nitrides is widely researched. Moreover, research and development concerning ferroelectric films having a spontaneous polarization characteristics have been attracted much attention in order to practically apply a non-volatile RAM that enables writing and reading with lower operating voltage and higher speed compared to conventional devices.

A method for manufacturing a conventional semiconductor device is explained below referring to FIGS. 6A to 6C. FIGS. 6A–6C are cross-sectional views showing the process of manufacturing conventional capacitor elements.

As shown in FIG. 6A, a film 12 for an electrode or a capacitor dielectric layer is formed on a substrate 11 composed of a semiconductor or the like by sputtering or a metal organic decomposition method, followed by forming a mask 13 for patterning the film 12. Next, as shown in FIG. 6B, the film 12 for the electrode or the capacitor dielectric layer is patterned by dry-etching. Subsequently, as shown in FIG. 6C, the mask 13 is removed.

In the semiconductor device manufactured in the conventional method, however, as shown in FIG. 6B, the dry-etching is accompanied by generating a reaction product 14 that adheres to sides of the mask 13. As the product 14 remains after removing the mask 13, a thin film formed to cover the capacitor element may suffer from inferior coverage, which prevents the capacitor element from operating normally.

SUMMARY OF THE INVENTION

Therefore, with the foregoing in mind, it is the object of the present invention to provide a method for manufacturing a capacitor element to prevent a reaction product from remaining adhered to the film for the electrode or the capacitor dielectric layer as a residue.

In order to achieve the above-described object, a method for manufacturing a capacitor element of the present invention comprises the steps of: forming a film for an electrode or a capacitor dielectric layer of the capacitor element, forming a pattered mask on the film, patterning the film by dry-etching utilizing the mask, removing from the mask reaction products generated by the dry-etching, and removing the mask from the film.

A first embodiment of the method comprises the steps of: forming a film for an electrode or a capacitor dielectric layer of the capacitor element, forming a pattered mask on the film, patterning the film by dry-etching utilizing the mask, washing the patterned film in a non-oxidizing atmosphere, and removing the mask from the film.

Thus, this embodiment can provide a capacitor element that can operate normally, because a reaction product generated in dry-etching is washed away before turning to a stable oxide so that a desirable etched shape of the film can be obtained.

A second embodiment of the method comprises the steps of: forming a film for the electrode or the capacitor dielectric layer of the capacitor element, forming a mask on a surface of the film, pattering the mask so that the mask has a side inclining from 5 degrees to 80 degrees away from the surface of the film, patterning the film by dry-etching utilizing the patterned mask, and removing the mask from the film.

Thus, this embodiment can provide a capacitor element that can operate normally, because a reaction product generated on the sides of the mask is removed physically by collision with ions for dry-etching so that a desirable etched shape of the film can be obtained.

A third embodiment of the method comprises the steps of: forming a film for an electrode or a capacitor dielectric layer of the capacitor element on a substrate, forming a patterned mask on the film, patterning the film by dry-etching utilizing the patterned mask while the substrate is maintained between 100° C. and 400° C., and removing the mask from the film.

Thus, this embodiment can provide a capacitor element that can operate normally, because a reaction product is kept to be evaporative enough to be easily exhausted in dry-etching so that a desirable etched shape of the film can be obtained.

These and other advantages of the present invention will become apparent those skilled in the art upon reading and understanding the following detailed description.

BRIEF DESCRIPTION OF THE DRAWINGS

FIG. 4D is a cross sectional view to show a step of removing the mask.

DESCRIPTION OF THE PREFERRED EMBODIMENTS

In the method of the present invention, a film for constituting the electrode preferably includes at least one material selected from platinum, palladium, ruthenium, ruthenium oxide, iridium, iridium oxide, titanium, titanium oxide and titanium nitride.

In the method of the present invention, a film for constituting the capacitor dielectric layer preferably includes at least one material selected from a high dielectric and a ferroelectric. The high electric preferably has a high dielectric constant of 50 or more. As a high dielectric, strontium titanate ($SrTiO_3$), barium strontium titanate ($Ba_xS_{1-x}TiO_3$; 0<x<1), tantalum oxide ($Ta_2O_5$) and the like can be used. As a ferroelectric, lead zirconium titanate ($Pb_xZr_{1-x}TiO_3$; 0<x<1), strontium bismuth tantalate ($SrBi_2Ta_2O_9$) and the like can be used.

In the method of the invention, the mask preferably includes at least one material selected from photoresist, silicon oxide, titanium, titanium oxide, titanium nitride, tantalum and tungsten.

In the method of the invention, the non-oxidizing atmosphere includes at least one gas selected from nitrogen, argon and helium.

In the method of the invention, the patterned film is washed with at least one liquid selected from water, hydrochloric acid, sulfuric acid, nitric acid, hydrofluoric acid and an organic solvent.

First Embodiment

Figure 1A:
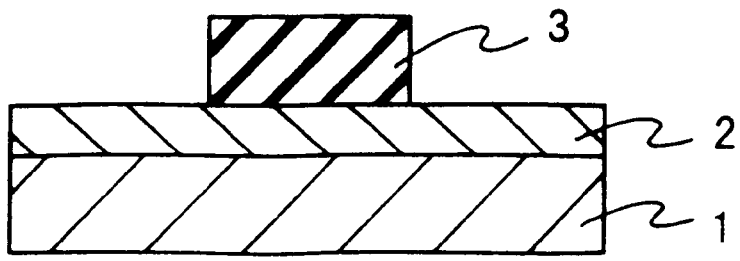
FIG. 1A is a cross sectional view to show a step of forming a film for an electrode or a capacitor dielectric layer and forming a mask on the film in a first embodiment of the present invention.
Figure 1B:
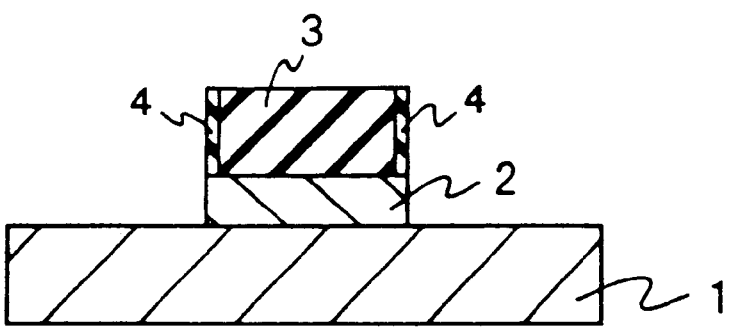
FIG. 1B is a cross sectional view to show a step of patterning the film by dry-etching.
Figure 1C:
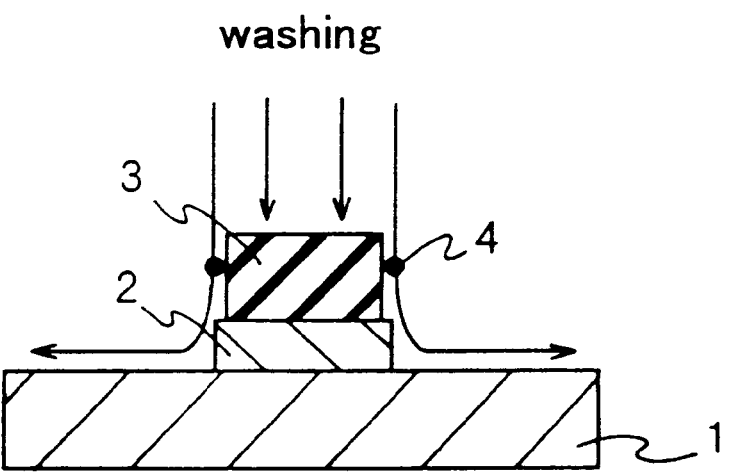
FIG. 1C is a cross sectional view to show a step of washing a reaction product from the mask.
Figure 1D:
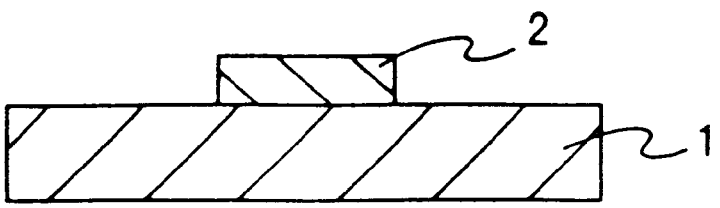
FIG. 1D is a cross sectional view to show a step of removing the mask.

FIGS. 1A–1D are cross-sectional views to show the steps of manufacturing a capacitor element in this embodiment. As shown in FIG. 1A, a film 2 for an electrode or a capacitor dielectric layer of a capacitor element is formed on a substrate 1 by sputtering or a metal organic decomposition method or the like. A semiconductor substrate composed of silicon, compound semiconductor such as GaAs or the like, and a glass substrate can be used for the substrate 1. On the film, a mask 3 is formed to give the film a predetermined pattern, followed by etching the film 2 by dry-etching as shown in FIG. 1B. While etching the film, a reaction product 4 adheres to the sides of the mask 3. The product 4 may turn into a stable compound by oxidation. Therefore, as shown in FIG. 1C, the substrate 1 is washed by a solution in a non-oxidizing atmosphere such as nitrogen so that the reaction product 4 is removed from the sides of the mask 3.

Thus, the reaction product that has adhered to the sides of the mask for etching can be easily removed by washing the mask and the etched film before exposing the product to the air.

For example, when using platinum as a material for the electrode of the capacitor element, some platinum reacts with chlorine gas contained as a main component of dry-etching gas to produce platinum dichloride or platinum tetrachloride, some of which adheres to the sides of mask. Platinum dichloride is soluble in hydrochloric acid, while platinum tetrachloride is soluble in water, ethanol or acetone. Therefore, any adhering of platinum compound can be washed away with the mixture of hydrochloric acid with water (diluted hydrochloric acid). Washing without exposing the compound to the air is necessary, because platinum dichloride or platinum tetrachloride may react with oxygen to produce platinum chloride oxide having a high chemical stability.

When $SrBi_2Ta_2O_9$ is used as a material for the capacitor dielectric layer of the capacitor element, some $SrBi_2Ta_2O_9$ reacts with chlorine gas or fluorine gas contained as a main component of dry-etching gas to produce a metal chloride or fluoride such as $BiCl_x$, $SrCl_x$, $TaCl_x$, $BiF_x$, $SrF_x$ and $TaF_x$, some of which adheres to the sides of mask. Washing with the mixture of hydrofluoric acid with nitric acid can remove the adhesion, because these compound are soluble in the mixture of the acids.

The film for the electrode or the capacitor dielectric layer formed as described above can have a thickness of 0.2 μm to 0.4 μm.

When platinum used as a material of the electrode is substituted with palladium, ruthenium, ruthenium oxide, iridium, iridium oxide, titanium, titanium oxide, titanium nitride or the like, the same effect can be obtained by washing the reaction product away with an appropriate detergent. Such a detergent can be selected according to the material of the film. For example, water at temperature of 80° C. or more and some organic solvents are effective in many cases as well as the acids as described above. The reaction product can be washed away in an inert gas such as argon and helium as well as nitrogen.

Second Embodiment

Figure 2A:
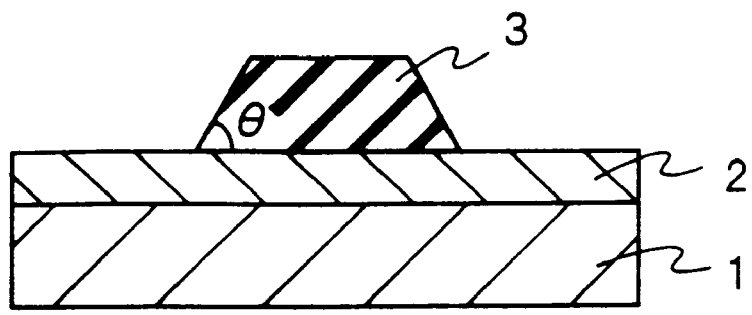
FIG. 2A is a cross sectional view to show a step of forming a film for an electrode or a capacitor dielectric layer and forming a mask that has a trapezoidal section in a second embodiment of the present invention.
Figure 2B:
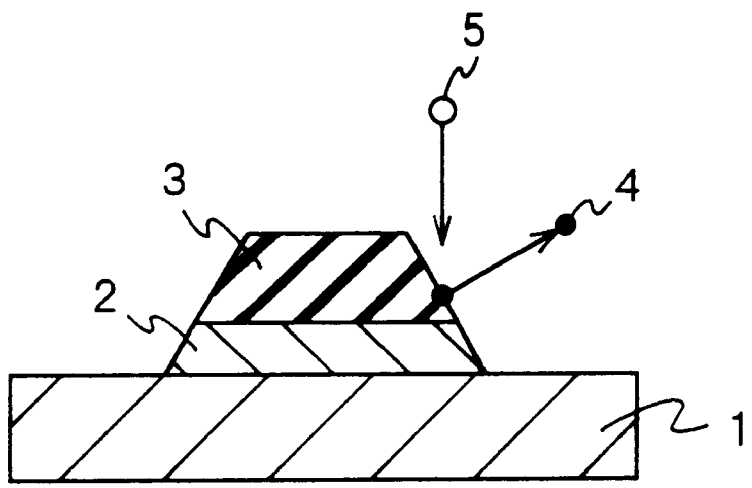
FIG. 2B is a cross sectional view to show a step of patterning the film by dry-etching with a reaction product removed from the sides of the film by collision with ions.
Figure 2C:
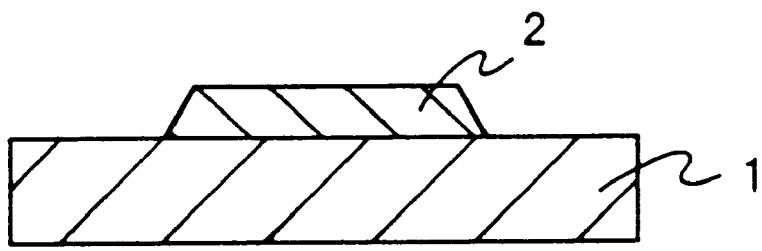
FIG. 2C is a cross sectional view to show a step of removing the mask.

FIGS. 2A–2C are cross-sectional views to show the steps of manufacturing a capacitor element in this embodiment. As shown in FIG. 2A, a film 2 for an electrode or a capacitor dielectric layer of a capacitor element is formed on a substrate 1 by the same method as described in the first embodiment. On the film 2, a mask 3 of photoresist is formed to give the film a predetermined pattern. The mask 3 formed in a predetermined pattern is baked to cause it to contract according to the baking temperature so that the mask has an inclined side. The angle of θ between the side of the mask 3 and the surface of the film 2 can be adjusted by a baking temperature. One example of a preferred angles is 75 degrees. The film 2 etched by dry-etching has an inclined side due to the inclined side of the mask 3. During the dry-etching, the reaction product 4 that has adhered to the sides of the mask 3 is removed by sputter-etching with ions 5 for the dry-etching, as shown in FIG. 2B. As shown in FIG. 2C, the mask 3 is removed from the film.

Thus, the reaction product that has adhered to the sides of the mask is exposed to the ions during dry-etching because of the inclination of the sides so that the reaction product does not remain on the film as a residue.

Figure 3:
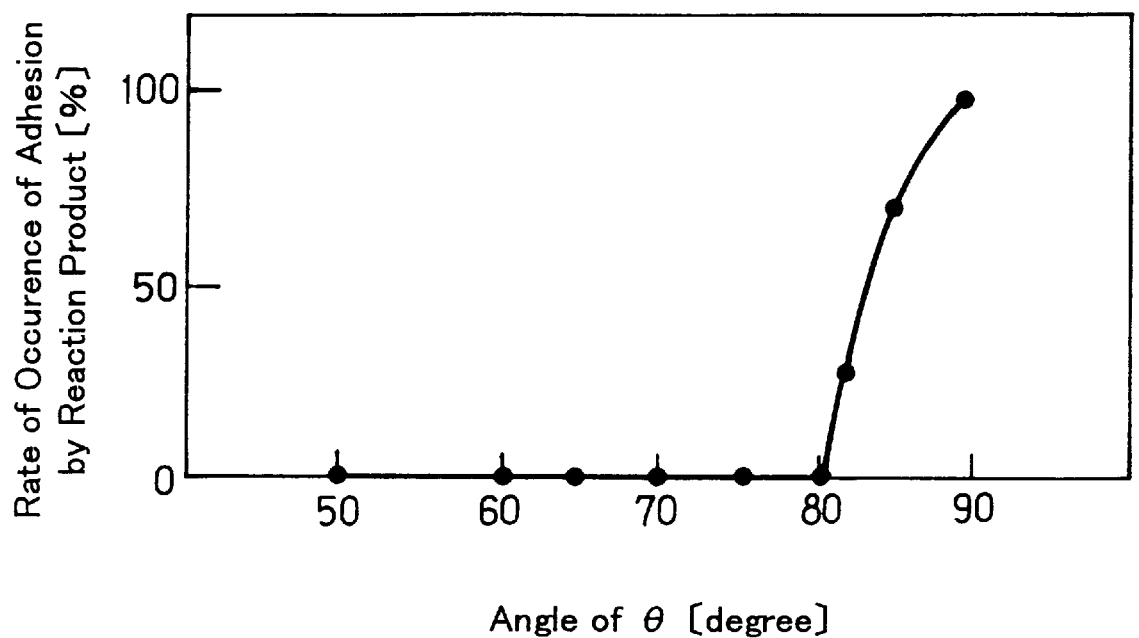
FIG. 3 is a graph to show the rate of occurrence of adhesion by a reaction product with respect to the angle of θ between the side of the mask and the surface of the film in the second embodiment of the present invention.

In order to examine the relationship between the effect of the angle of θ and the rate of occurrence of adhesion by a reaction product, some masks having various kinds of the angle of θ were utilized for etching the film. Four masks were used per angle. The rate of occurrence was determined by observing with a scanning electron microscope (SEM). As a result, the angle of 80 degrees or less was found to make it possible to realize a desirable etched shape of the film without the residue as shown in FIG. 3. The angle of 5 degrees or less may make it difficult that the mask works effectively especially in the edge portion of the mask. Therefore, the angle of θ is preferably between 5 and 80 degrees.

When photoresist used as a material of the mask is substituted with silicon oxide, titanium, titanium oxide, titanium nitride, tantalum, tungsten or the like, the same effect can be obtained.

Third Embodiment

Figure 4A:
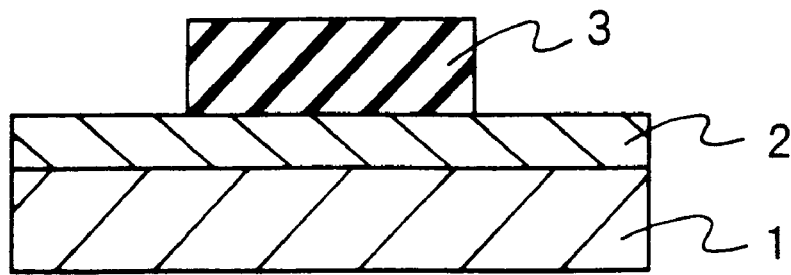
FIG. 4A is a cross sectional view to show a step of forming a film for an electrode or a capacitor dielectric layer on a substrate and forming a mask on the film in a third embodiment of the present invention.
Figure 4B:
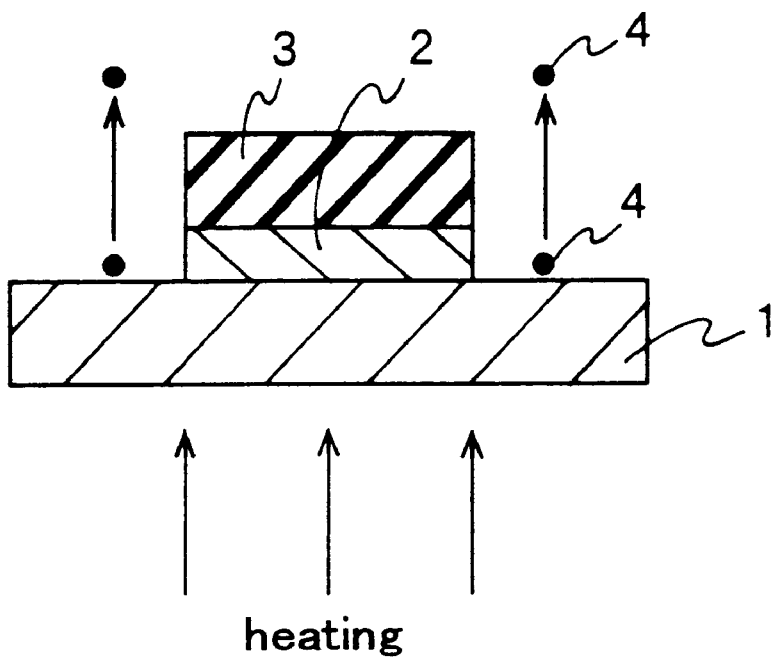
FIG. 4B is a cross sectional view to show a step of patterning the film by dry-etching with the substrate heated.
Figure 4C:
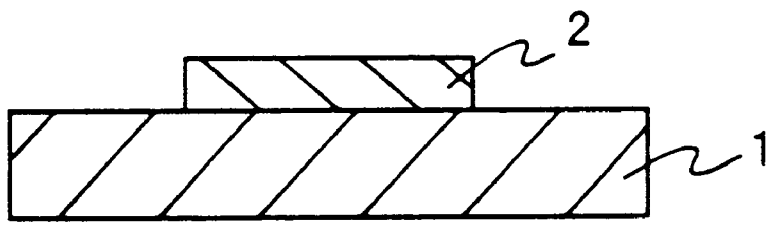
FIG. 4C is a cross sectional view to show a step of removing the mask.

FIGS. 4A–4C are cross-sectional views to show the steps of manufacturing a capacitor element in this embodiment. As shown in FIG. 4A, a film 2 for an electrode or a capacitor dielectric layer of a capacitor element is formed on a substrate 1 by the same method as described in the first embodiment. On the film 2, a mask 3 is formed to give the film a predetermined pattern. As shown in FIG. 4B, the film 2 is etched by dry-etching while heating the substrate 1. One example of the preferred temperatures of the substrate is 120° C. During the dry-etching, the reaction product 4 is kept in an evaporative state so that the product can be exhausted without adhering to the sides of the mask 3. As shown in FIG. 4C, the mask 3 is finally removed from the film.

Thus, the reaction product that may adhere to the sides of the mask in room temperature is sufficiently evaporated by heating so as not to remain on the film as a residue.

Figure 5:
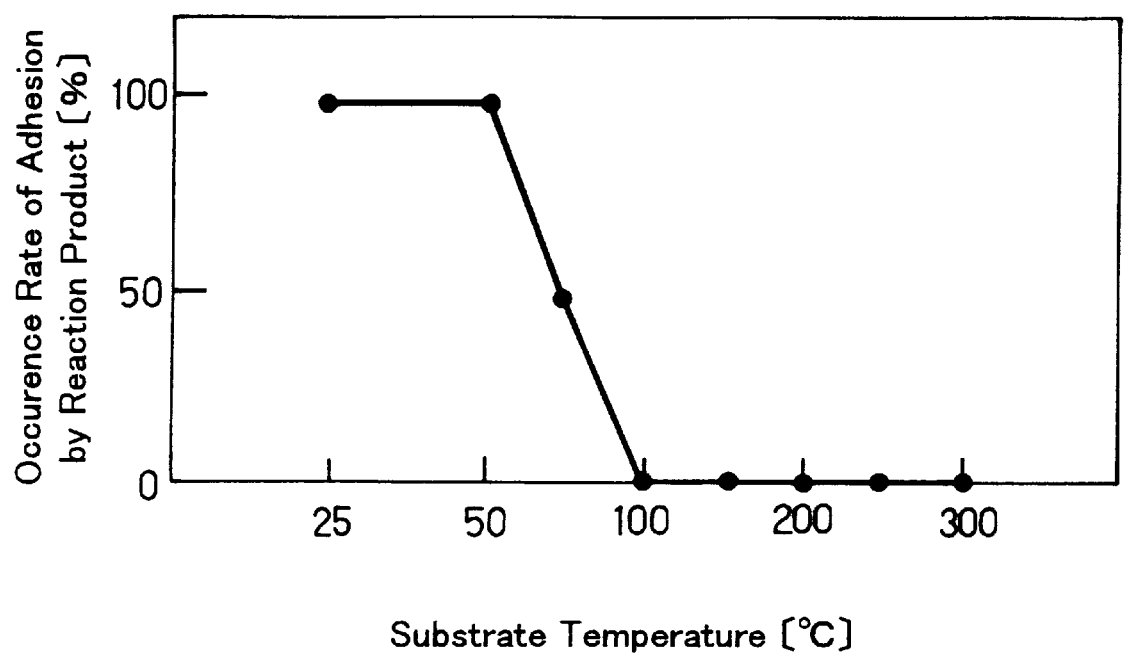
FIG. 5 is a graph to show an occurrence rate of adhesion by a reaction product with respect to a substrate temperature in the third embodiment of the present invention.
Figure 6A:
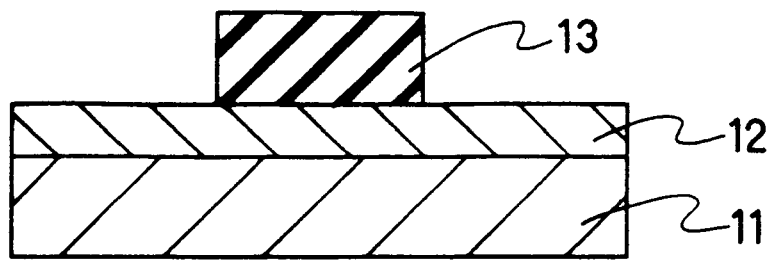
FIG. 6A is a cross sectional view to show a step of forming a film for an electrode or a capacitor dielectric layer on a substrate and forming a mask on the film in a conventional method.
Figure 6B:
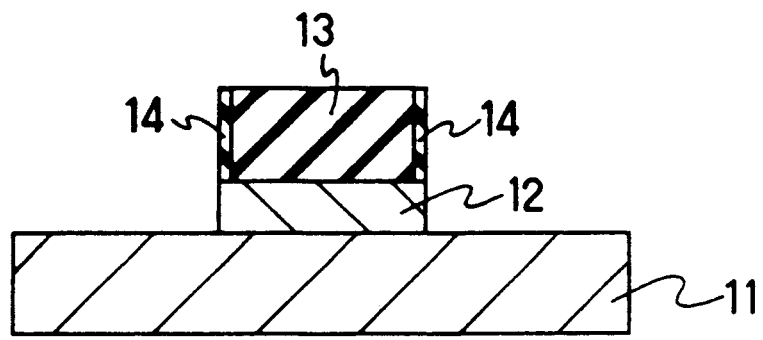
FIG. 6B is a cross sectional view to show a step of patterning the film by dry-etching.
Figure 6C:
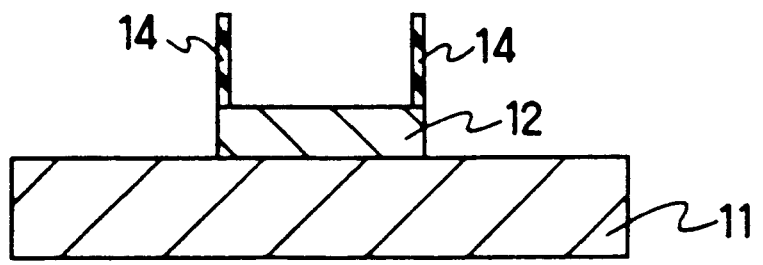
FIG. 6C is a cross sectional view to show a step of removing the mask.

In order to examine the relationship between the substrate temperature and the rate of occurrence of adhesion by a reaction product, some films were etched by dry-etching while the substrate was kept at various temperatures. Four masks were used per temperature. The occurrence rate is determined by observing with a SEM. As a result, the substrate temperature of 100° C. or more was found to make it possible to realize a desirable etched shape of the film without the residue as shown in FIG. 5. The temperature of more than 400° C. tends to deteriorate the capacitor element itself. Therefore, the temperature of the substrate during the dry-etching is preferably between 100° C. and 400° C.

As explained in the above embodiments, the invention provides a reliable capacitor element having a precise etched shape, because the reaction product accompanied by etching the film does not remain adhered to the film.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A method for manufacturing a capacitor element including an electrode and a capacitor dielectric layer, the method comprising the steps of:

forming a film for at least one component of the capacitor element selected from the electrode and the capacitor dielectric layer;

forming a pattered mask on the film;

patterning the film by dry-etching utilizing the mask;

removing from the mask reaction products generated by the dry-etching; and removing the mask from the film.

2. A method according to claim 1, wherein the removing of the mask reaction products is carried out by washing the patterned film in a non-oxidizing atmosphere.

3. A method according to claim 2, wherein the non-oxidizing atmosphere includes at least one gas selected from nitrogen, argon and helium.

4. A method according to claim 2, wherein the patterned film is washed with at least one liquid selected from water, hydrochloric acid, sulfuric acid, nitric acid, hydrofluoric acid and organic solvent.

5. A method according to claim 1, wherein the patterned mask has a side inclining from 5 degrees to 80 degrees with respect to the surface of the film, whereby the reaction products are removed by ions used for dry-etching.

6. A method according to claim 1, wherein the film is patterned by dry-etching while a substrate sporting the film is maintained at a temperature between 100° C. and 400° C.

7. A method according to claim 1, wherein the film is for the electrode and includes at least one material selected from platinum, palladium, ruthenium, ruthenium oxide, iridium, iridium oxide, titanium, titanium oxide and titanium nitride.

8. A method according to claim 1, wherein the film is for the capacitor dielectric layer and includes at least one material selected from a dielectric with dielectric constant of 50 or more and a ferroelectric.

9. A method according to claim 1, wherein the mask includes at least one material selected from photoresist, silicon oxide, titanium, titanium oxide, titanium nitride, tantalum and tungsten.

\* \* \* \* \*